United States Patent
Daudin et al.

(10) Patent No.: US 12,206,040 B2
(45) Date of Patent: Jan. 21, 2025

(54) METHOD FOR HOMOGENISING THE CROSS-SECTION OF NANOWIRES FOR LIGHT-EMITTING DIODES

(71) Applicants: Aledia, Echirolles (FR); Commissariat à l'Énergie Atomique et aux Énergies Alternatives, Paris (FR); Universite Grenoble Alpes, Saint Martin d'Heres (FR)

(72) Inventors: Bruno-Jules Daudin, Grenoble (FR); Walf Chikhaoui, Voiron (FR); Marion Gruart, Saint-Egreve (FR); Philippe Gilet, Teche (FR)

(73) Assignees: Aledia, Echirolles (FR); Commissariat à l'Énergie Atomique et aux Énergies Alternatives, Paris (FR); Universite Grenoble Alpes, Saint Martin d'Heres (FR)

( * ) Notice: Subject to any disclaimer, the term of this patent is extended or adjusted under 35 U.S.C. 154(b) by 345 days.

(21) Appl. No.: 17/619,820

(22) PCT Filed: Jun. 25, 2020

(86) PCT No.: PCT/EP2020/067959
§ 371 (c)(1),
(2) Date: Dec. 16, 2021

(87) PCT Pub. No.: WO2020/260541
PCT Pub. Date: Dec. 30, 2020

(65) Prior Publication Data
US 2022/0359782 A1    Nov. 10, 2022

(30) Foreign Application Priority Data
Jun. 25, 2019  (FR) ...................... 1906898

(51) Int. Cl.
*H01L 33/00*   (2010.01)
*H01L 33/30*   (2010.01)
*H01L 33/18*   (2010.01)

(52) U.S. Cl.
CPC .......... *H01L 33/0062* (2013.01); *H01L 33/30* (2013.01); *H01L 33/18* (2013.01)

(58) Field of Classification Search
None
See application file for complete search history.

(56) References Cited

U.S. PATENT DOCUMENTS

2010/0080256 A1* 4/2010 Liu .................. H01S 5/347
                                          372/45.01
2012/0161663 A1* 6/2012 Gregersen ............ H01L 33/06
                                          315/246

(Continued)

FOREIGN PATENT DOCUMENTS

EP   1 796 180 A1   6/2007
FR   3 044 470 A1   6/2017
WO   WO 2019/002786 A1   1/2019

OTHER PUBLICATIONS

WO20190022786 (A1) (Year: 2019).*

(Continued)

*Primary Examiner* — Bilkis Jahan
(74) *Attorney, Agent, or Firm* — Wolf, Greenfield & Sacks, P.C.

(57) ABSTRACT

A method of manufacturing an optoelectronic device including-light-emitting diodes comprising the forming of three-dimensional semiconductor elements made of a III-V compound, each comprising a lower portion and an upper portion and, for each semiconductor element, the forming of an active area covering the top of the upper portion and the forming of at least one semiconductor area of the III-V compound covering the active area. The upper portions are (Continued)

formed by vapor deposition at a pressure lower than 1.33 mPa.

12 Claims, 5 Drawing Sheets

(56) References Cited

U.S. PATENT DOCUMENTS

| | | | |
|---|---|---|---|
| 2014/0110664 A1* | 4/2014 | Lo | H01L 21/02458 257/14 |
| 2015/0014631 A1* | 1/2015 | Ohlsson | H01L 21/02639 438/507 |
| 2015/0207028 A1* | 7/2015 | Romano | H01L 33/22 438/39 |
| 2016/0365480 A1 | 12/2016 | Mi et al. | |

OTHER PUBLICATIONS

International Search Report and Written Opinion for International Application No. PCT/EP2020/067959, mailed Sep. 9, 2020.
International Preliminary Report on Patentability for International Application No. PCT/EP2020/067959, mailed Jan. 6, 2022.

\* cited by examiner

METHOD FOR HOMOGENISING THE CROSS-SECTION OF NANOWIRES FOR LIGHT-EMITTING DIODES This application is a national stage filing under 35 U.S.C. § 371 of International Patent Application Serial No. PCT/EP2020/067959, filed Jun. 25, 2020, which claims priority to French patent application FR19/06898, filed Jun. 25, 2019. The contents of these applications are incorporated herein by reference in their entirety.

TECHNICAL BACKGROUND

The present invention generally concerns optoelectronic devices with light-emitting diodes comprising three-dimensional semiconductor elements, for example, microwires, nanowires, micrometer- or nanometer-range conical elements, or micrometer- or nanometer-range frustoconical elements, and methods of manufacturing such devices.

PRIOR ART

The improvement of axial-type light-emitting diodes, comprising an active area formed at the top of each three-dimensional element, is here more particularly considered. Call active area of the light-emitting diode the region from which most of the electromagnetic radiation delivered by the light-emitting diode is emitted.

The three-dimensional elements considered herein comprise a semiconductor material mainly comprising a group-III element and a group-V element (for example, gallium nitride GaN), called III-V compound hereafter. Such devices are for example described in patent U.S. Pat. No. 9,728,680.

Each active area is sandwiched between the associated three-dimensional semiconductor element, which is generally doped with a first conductivity type, and a semiconductor layer of the same III-V compound as the semiconductor element and doped with the opposite conductivity type.

An example of a method of manufacturing the optoelectronic device comprises the forming of the three-dimensional semiconductor elements by metal-organic chemical vapor deposition (MOCVD). It may however be difficult to accurately control the mean diameter of the semiconductor elements with such a growth method. Thereby, a same optoelectronic device may comprise semiconductor elements having different mean diameters. The wavelength of the radiation emitted by the active area of the light-emitting diode may depend on the mean diameter of the active area and thus on the mean diameter of the semiconductor element having the active area formed thereon. An uncontrolled wavelength dispersion of the radiations emitted by the light-emitting diodes may then be obtained.

SUMMARY

Thus, an object of an embodiment is to at least partly overcome the disadvantages of the previously-described optoelectronic devices and of their manufacturing methods.

Another object of an embodiment is to decrease the wavelength dispersion of the radiations emitted by the light-emitting diodes of the optoelectronic device.

Thus, an embodiment provides a method of manufacturing an optoelectronic device comprising light-emitting diodes comprising the forming of three-dimensional semiconductor elements made of a III-V compound, each comprising a lower portion and an upper portion and, for each semiconductor element, the forming of an active area covering the top of the upper portion and the forming of at least one semiconductor layer of the III-V compound covering the active area. The upper portions are formed by vapor deposition at a pressure lower than 1.33 mPa.

According to an embodiment, the lower portions are formed by selective etching or by epitaxial growth, preferably by a metal-organic chemical vapor deposition, or by molecular beam epitaxy.

According to an embodiment, the upper portions are formed by molecular beam epitaxy.

According to an embodiment, for each semiconductor element, the upper portion is flared with respect to the lower portion.

According to an embodiment, for each semiconductor element, the top of the upper portion has an area greater by at least 20% than the cross-section area of the lower portion.

According to an embodiment, for the forming of the upper portions, the III/V ratio is in the range from 1.3 to 2.

According to an embodiment, for the forming of the upper portions, the temperature of the upper portions is in the range from 700° C. to 850° C.

According to an embodiment, for the forming of the lower portions, the III/V ratio is in the range from 0.01 to 1.

According to an embodiment, for the forming of the lower portions, the temperature of the lower portions is in the range from 700° C. to 850° C.

According to an embodiment, the active areas are formed by molecular beam epitaxy.

According to an embodiment, the lower portions of the three-dimensional semiconductor elements are microwires, nanowires, micrometer- or nanometer-range conical elements, or micrometer- or nanometer-range frustoconical elements.

According to an embodiment, the active areas are the regions having most of the electromagnetic radiation supplied by the light-emitting diodes emitted therefrom.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. In particular, the optoelectronic device biasing and control means are well known and will not be described.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use.

Unless specified otherwise, the expressions "around", "approximately", "substantially" and "in the order of" signify within 10%, and preferably within 5%. Unless specified otherwise, the expressions "around", "approximately", "substantially" and "in the order of" signify within 10%, and preferably within 5%.

The present description concerns optoelectronic devices comprising three-dimensional semiconductor elements, for example, microwires, nanowires, micrometer- or nanometer-range conical elements, or micrometer- or nanometer-range frustoconical elements. The term "microwire", "nanowire", "conical element", or "frustoconical element" designates a three-dimensional structure having a shape, for example, cylindrical, conical, or frustoconical, elongated along a main direction, called axis hereafter, having at least two dimensions, called minor dimensions, in the range from 5 nm to 2.5 µm, preferably from 50 nm to 1 µm, the third dimension, called major dimension, being greater than or equal to 1 time, preferably greater than or equal to 5 times, and more preferably still greater than or equal to 10 times, the largest minor dimension, for example, in the range from 1 µm to 50 µm. In particular, a conical or frustoconical element may be a circular conical or circular frustoconical element or a pyramidal conical or pyramidal frustoconical element. In the following description, embodiments are described for optoelectronic devices comprising microwires or nanowires, generally called wires. However, these embodiments may be implemented for elements other than microwires or nanowires, for example, conical or frustoconical elements. In the following description, call mean diameter of a wire the diameter of the disk having the same surface area as the cross-section area of the wire. Further, call central wavelength of a radiation the wavelength of the radiation which transports the most energy.

Figure 1:
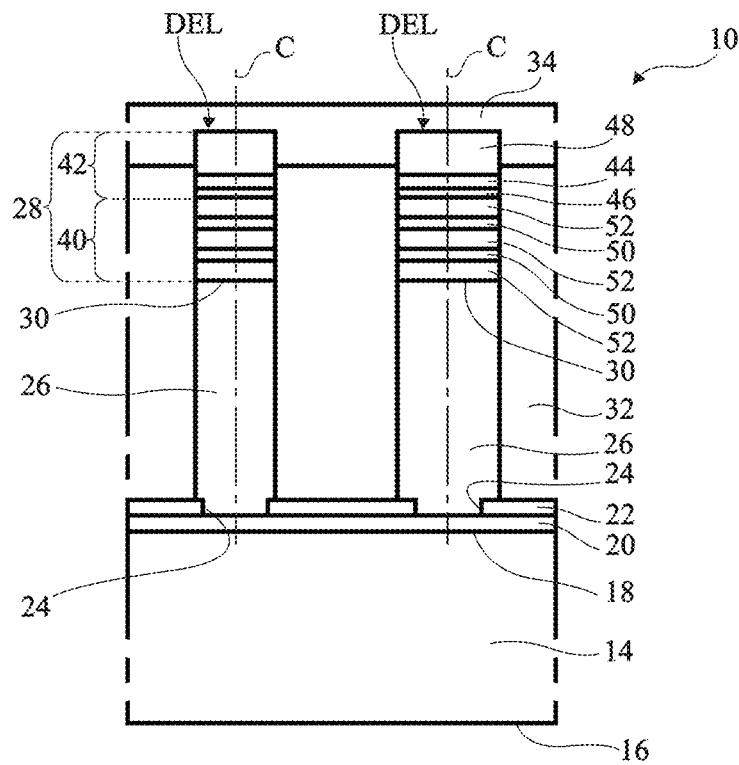
FIG. 1 is a partial simplified cross-section view of an example of an optoelectronic device with axial-type light-emitting diodes.

FIG. 1 is a partial simplified cross-section view of an example of an optoelectronic device 10 with axial-type light-emitting diodes. Optoelectronic device 10 comprises, from bottom to top in FIG. 1:

a substrate 14, for example, a semiconductor substrate, comprising parallel surfaces 16 and 18, preferably planar, surface 18 being treated to promote the growth of wires. This treatment is schematically shown in FIG. 1 by a seed layer 20 made of a material favoring the growth of wires, on surface 18 of substrate 14;

an insulating layer 22 covering seed layer 20 and comprising through openings 24;

wires 26 having parallel axes C, two wires 26 being shown in FIG. 1 at least partly doped with a first conductivity type, for example, n-type doped;

for each wire 26, a head 28 covering the upper surface 30, also called top, of wire 26;

an insulating layer 32 covering the lateral surfaces of wires 26 and partially the lateral surfaces of heads 28; and an electrode layer 34 covering insulating layer 32 and in contact with heads 28.

Optoelectronic device 10 comprises another electrode, not shown, to bias the base of wires 26.

Each head 28 comprises, from bottom to top in FIG. 1:
an active area 40 covering the upper surface 30 of wire 26; and
a semiconductor stack 42 covering active area 40 and comprising a doped semiconductor layer 44 of a second conductivity type opposite to that of wire 26, for example, p-type doped, and covering active area 40.

The assembly formed by each wire 26 and the associated head 28 forms a light-emitting diode DEL in axial configuration.

Semiconductor stack 42 may further comprise an electron-blocking layer 46 between active area 40 and semiconductor layer 44 and a semiconductor bonding layer 48 covering semiconductor layer 44 on the side opposite to active area 40, bonding layer 48 being covered with electrode layer 34 and in contact with electrode layer 34. Electron-blocking layer 46 is in contact with active area 40 and semiconductor layer 44, and enables to optimize the presence of electric carriers in active area 40. Bonding layer 48 may be made of the same material as semiconductor layer 44 and doped with the same conductivity type as semiconductor layer 44 but with a greater dopant concentration to allow the forming of an ohmic contact between semiconductor layer 44 and electrode layer 34.

Active area 40 is the area of light-emitting diode DEL from which most of the electromagnetic radiation delivered by light-emitting diode DEL is emitted. According to an example, active area 40 may comprise confinement means. Active area 40 may comprise at least one quantum well, comprising a layer of a semiconductor material having a bandgap energy lower than that of wire 26 and of semiconductor layer 44, preferably interposed between two barrier layers, thus improving the confinement of charge carriers, and the barrier layers may be made of the same material as wire 26 and non-intentionally doped. Active area 40 may be formed of a single quantum well or of a plurality of quantum wells. As an example, in FIG. 1, an alternation along axis C of two quantum wells 50 and of three barrier layers 52 has been shown.

An example of a method of manufacturing optoelectronic device 10 comprises the growth of wires 26, of active areas 40, and of semiconductor stacks 42 by implementing a growth method which favors a crystal growth along axis C of wires 26. The wire growth method may be a method of metal-organic chemical deposition (MOCVD) type, also known as metal-organic vapor phase epitaxy (MOVPE). The MOCVD method particularly has the advantage of high growth speeds. The growth of each wire 26 starts in one of openings 24 and continues outside of opening 24. The mean diameter of wire 26 outside of opening 24 may be different from the mean diameter of opening 24, and is generally greater than the mean diameter of opening 24.

A disadvantage is that the MOCVD method may not enable to accurately control the mean diameter of wires 26. Thereby, a significant dispersion of the mean diameters of the wires 26 of optoelectronic device 10 may be obtained. For each light-emitting diode DEL, the mean diameter of active area 40 depends on the mean diameter of wire 26 and may be substantially equal to the mean diameter of wire 26. When active area 40 comprises a quantum well or quantum wells, the central wavelength of the radiation emitted by the active area 40 of light-emitting diode DEL particularly depends on the mean diameter of active area 40 and thus on the mean diameter of wire 26 having active area 40 formed thereon. A significant dispersion of the central wavelengths of the radiations emitted by the light-emitting diodes may then be obtained.

The inventors have shown that, after a first step of growth of wires 26 by MOCVD where a lower portion of each wire is formed, and before the step of forming of active areas 40, by carrying out a second step of growth of wires 26 by a specific growth method, there is formed, for each wire 26, an upper portion delimiting upper surface 30, on which active area 40 will be formed so that the dispersion of the mean diameters of the upper surfaces is smaller than the dispersion of the mean diameters of the lower portions of the wires. The specific growth methods are methods of growth by vapor deposition under vacuum at a pressure lower than 1.33 mPa ($10^{-5}$ Torr), preferably smaller than 0.0133 mPa ($10^{-7}$ Torr), for which molecular beams are projected onto the surfaces on which a crystal growth is desired. It for example is a molecular-beam epitaxy (MBE), particularly a plasma-assisted molecular-beam epitaxy (PA-MBE), or ammonia-assisted MBE.

Figure 2:
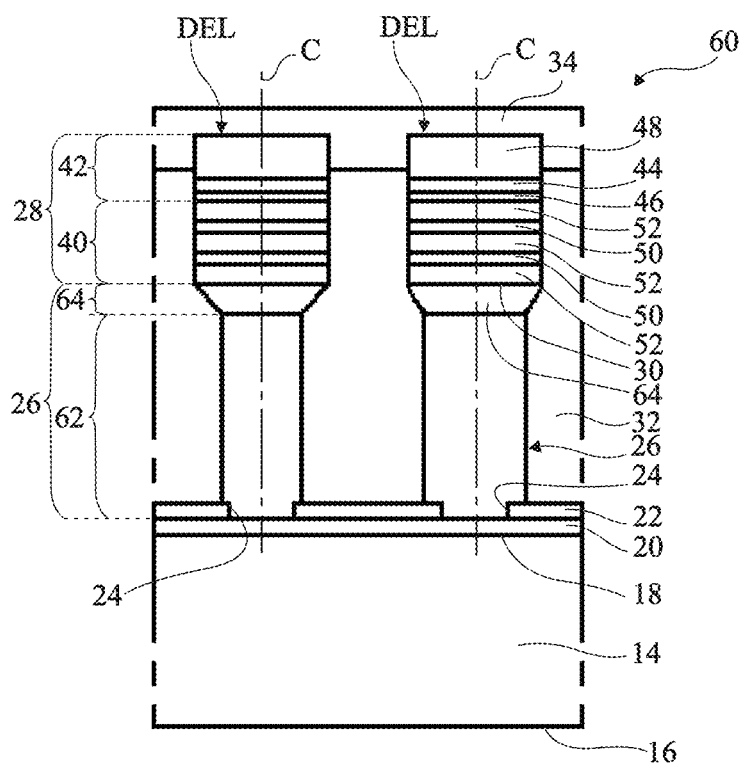
FIG. 2 is a partial simplified cross-section view of an embodiment of an optoelectronic device with axial-type light-emitting diodes.

FIG. 2 is a cross-section view of an embodiment of an optoelectronic device 60. Optoelectronic device 60 comprises all the elements of the optoelectronic device 10 shown in FIG. 1, with the difference that each wire 26 comprises a lower portion 62 of substantially constant cross-section area extending in an upper portion 64 which, in the present embodiment, has an outward-flared shape for which the cross-section area increases along axis C as the distance to substrate 14 increases. According to another embodiment, wires 26 may distribute into first wires, each comprising outward-flared upper portion 64 and into second wires for each of which upper portion 64 has the shape of a truncated pyramid having its large base resting on lower portion 62.

Preferably, for each wire 26, the upper surface 30 of the upper portion 64 of wire 26 corresponds to a substantially planar surface orthogonal to the axis C of wire 26. Preferably, the area of upper surface 30 is greater by at least 20% than the cross-section area of the lower portion 62 of wire 26. The height of the upper portion 64 of each wire 26 measured along axis C may be in the range from 5 nm to 2 µm, preferably from 20 nm to 500 nm. The height of the lower portion 62 of each wire 26 measured along axis C may be in the range from 200 nm to 5 µm. For each wire 26, the mean diameter of the lower portion 62 of wire 26 may be in the range from 50 nm to 10 µm, preferably from 100 nm to 2 µm, more preferably from 100 nm to 1 µm. The cross-section of the lower portion 62 of wire 26 may have different shapes, for example, oval, circular, or polygonal, in particular rectangular, square, or hexagonal.

Wires 26, barrier layers 52, semiconductor layers 44, and bonding layers 48 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. The III-V compounds of wires 26 and of layers 44, 48 may comprise a dopant, for example, silicon (Si) which is an n-type dopant for the III-V compounds or magnesium (Mg), which is a p-type dopant for the III-V compounds.

The semiconductor material of the quantum well 50 or of the quantum wells 50 of active area 40 may comprise the III-V compound of wire 26 and of semiconductor layer 44 having at least one additional element incorporated into it. As an example, in the case of wires 26 made of GaN, the additional element is for example indium (In). The atomic percentage of the additional element is a function of the desired optical properties and of the emission spectrum of light-emitting diode DEL. When the upper portion 64 of wire 26 is not intentionally doped, it may replace one of the barrier layers 52 of active area 40.

Electron blocking layer 46 may be formed of a ternary alloy, for example, of aluminum gallium nitride (AlGaN) or of aluminum indium nitride (AlInN).

Substrate 14 may correspond to a monoblock structure or may correspond to a layer covering a support made of another material. Substrate 14 is preferably a semiconductor substrate, for example, a substrate made of silicon, of germanium, of silicon carbide, of a III-V compound, such as GaN or GaAs, or a conductive substrate, for example, a metal substrate, particularly made of copper, of titanium, of molybdenum, of an alloy based on nickel or steel, or a sapphire substrate. Preferably, substrate 14 is a single-crystal silicon substrate. Preferably, it is a semiconductor substrate compatible with manufacturing methods implemented in microelectronics. Substrate 14 may correspond to a multi-layer structure of silicon-on-insulator type, also called SOI.

Seed layer 20 is made of a material favoring the growth of wires 26. As an example, the material forming seed layer 20 may be a nitride, a carbide, or a boride of a transition metal from column IV, V, or VI of the periodic table of elements, or a combination of these compounds. As an example, seed layer 20 may be made of aluminum nitride (AlN). Seed layer 20 may have a monolayer structure or may correspond to a stack of two layers or of more than two layers. Examples of a material for seed layer 20 are described in patent FR2997557.

Insulating layer 22 may be made of a dielectric material, for example, silicon oxide ($SiO_2$) or silicon nitride ($Si_xN_y$, where x is approximately equal to 3 and y is approximately equal to 4, for example, $Si_3N_4$). As an example, the thickness of insulating layer 22 is in the range from 5 nm to 100 nm, for example, equal to approximately 30 nm. Insulating layer 22 may have a monolayer structure or may correspond to a stack of two layers or of more than two layers.

Insulating layer 32 may be made of a dielectric material, for example, silicon oxide ($SiO_2$) or silicon nitride ($Si_xN_y$, where x is approximately equal to 3 and y is approximately equal to 4, for example, $Si_3N_4$). Insulating layer 32 may have a monolayer structure or may correspond to a stack of two layers or of more than two layers. As an example, insulating layer 32 may be made of a polymer material, of an inorganic material, or of a polymer material and of an inorganic material. As an example, the inorganic material may be titanium oxide ($TiO_2$) or aluminum oxide ($Al_xO_y$, where x is approximately equal to 2 and y is approximately equal to 3, for example, $Al_2O_3$).

Electrode layer 34 is capable of biasing the active area 40 covering each wire 26 and of giving way to the electromagnetic radiation emitted by light-emitting diodes DEL. The material forming electrode layer 34 may be a transparent and conductive material such as indium tin oxide (ITO), zinc oxide, doped or not with aluminum or gallium, or graphene. As an example, electrode layer 34 has a thickness in the range from 5 nm to 200 nm, preferably from 20 nm to 50 nm.

Figure 3:
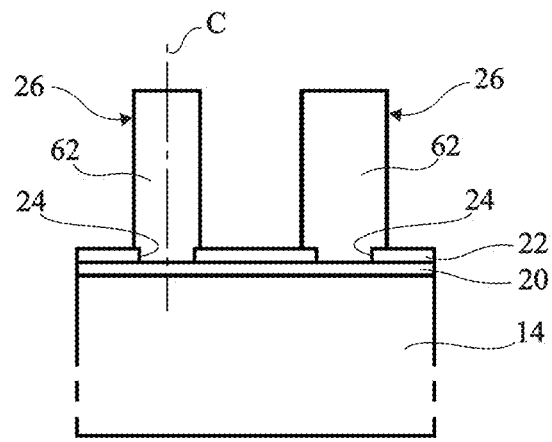
FIG. 3 illustrates a step of an embodiment of a method of manufacturing the optoelectronic device shown in FIG. 2.
Figure 4:
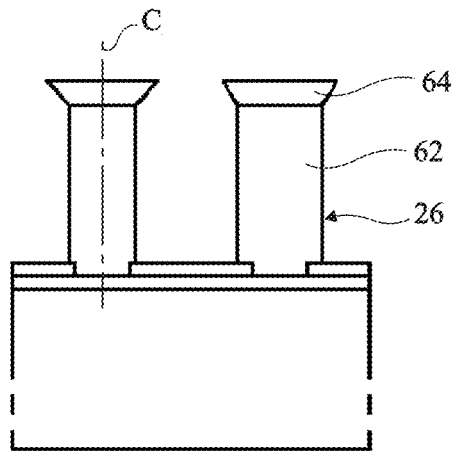
FIG. 4 illustrates another step of the method.
Figure 5:
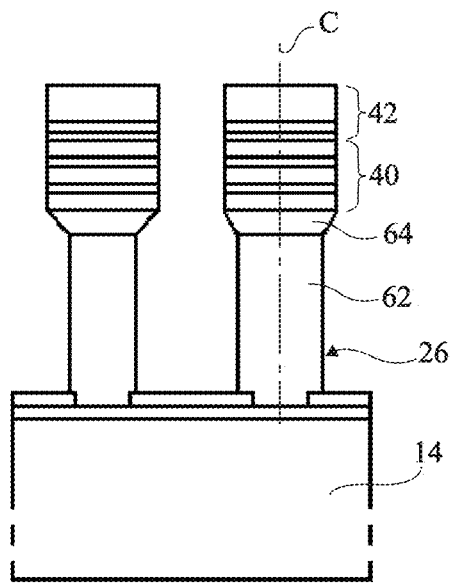
FIG. 5 illustrates another step of the method.

FIGS. 3 to 5 are partial simplified cross-section views of the structure obtained at successive steps of another embodiment of a method of manufacturing the optoelectronic device 60 shown in FIG. 2.

FIG. 3 shows the structure obtained after the steps of:
forming on substrate 14 of seed layer 20;
forming of insulating layer 22 on seed layer 20;
forming of openings 24 in insulating layer 22 to expose portions of seed layer 20 at the desired locations of wires 26, the diameter of openings 24 substantially corresponding to the mean diameter of wires 26; and
growth of the lower portions 62 of wires 26 from seed layer 20 in openings 24.

Seed layer 20 and insulating layer 22 may be formed by chemical vapor deposition (CVD), physical vapor deposition (PVD), or ALD.

According to an embodiment, the growth of the lower portions 62 of wires 26 is achieved by MOCVD. As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH). Call III/V ratio the ratio of the gas flow of the precursor of the group-III element to the gas flow of the precursor of the group-V element. The pressure in the reactor is in the range from 50 Torr (approximately 7 kPa) to 500 Torr (70 kPa). The growth conditions in the reactor are adapted to promoting a preferential growth of the lower portion 62 of each wire 26 along its axis C. This means that the growth speed of wire 26 along axis C is much greater, preferably by at least one order of magnitude, than the growth speed of wire 26 along a direction perpendicular to axis C. According to an embodiment, the III/V ratio is in the range from 0.01 to 1, preferably in the range from 0.01 to 0.1. The temperature in the reactor is, for example, in the range from 900° C. to 1,150° C., preferably from 1,000° C. to 1,100° C.

According to another embodiment, the lower portions 62 of wires 26 may be formed by etching in a layer of the III-V compound, particularly according to a so-called top-down technology.

FIG. 4 shows the structure obtained after the growth of the upper portions 64 of wires 26. According to an embodiment, the growth of the upper portions 64 of wires 26 is performed by PA-MBE. The pressure in the reactor is smaller than 1.33 mPa ($10^{-5}$ Torr), preferably in the range from $10^{-4}$ (approximately 13.3 mPa) to $10^{-7}$ Torr (approximately 0.0133 mPa). The III/V ratio, which then is the ratio of the atomic flux of the group-III element to the atomic flux of the group-V element, is in the range from 0.8 to 2. To obtain a widening of the upper portion 64 of each wire 26, the III/V ratio is preferably greater than 1.3, particularly in the range from 1.3 to 2. To obtain a widening of the upper portion 64 of each wire 26, the temperature in the reactor is preferably in the range from 750° C. to 875° C., for example, equal to approximately 850° C. The phase of growth of upper portions 64 by PA-MBE may cause the forming of a GaN shell on the lateral walls of the lower portions 62 of wires 26.

Calling $\phi_{Ga}$ the atomic flux of the group-III element, $\phi_N$ the atomic flux of the group-V element, D the diameter of the lower portion 62 of the wire (which is approximately considered as cylindrical with a circular base), θ the angle of incidence of the atomic flux of the group-III element and of the atomic flux of the group-V element on the upper surface 30 of wire 26, $n_{Ga}$ the effective number of atoms of the group-III element on upper surface 30, and $n_N$ the effective number of atoms of the group-V element on upper surface 30, and considering that the diffusion length λ of the group-III element on the lateral walls of the wires only depends on temperature, the following relation Math 1 can be determined:

$$\frac{n_{Ga}}{n_N} \sim k(T) \frac{\phi_{Ga}}{\phi_N} (1 + \frac{4\lambda}{D} \tan\theta) \qquad \text{[Math 1]}$$

where k(T) is a factor taking into account the temperature-dependence of the desorption of the group-III element from the lateral walls and from the upper surface of wire 26.

In steady state, the dimensions of upper surface 30 are determined by ratio $n_{Ga}/n_N$. There thus advantageously appears that when the upper portions 64 of wires 26 are formed by PA-MBE, the dimensions of the upper surface 30 of each upper portion 64, where active area 40 is formed, vary towards dimensions which are substantially independent from the mean diameter of the lower portion 62 of wire 26 from which upper portion 64 extends and which depend on the III/V ratio used for the forming of upper portion 64. This thus enables to accurately control the dimensions of the upper surface 30 of upper portion 64 and thus the lateral dimensions of active area 40. This enables to at least partially compensate for the dispersion of the mean diameters of the lower portions 62 of wires 26 that may result from the method of manufacturing these lower portions 62. If the growth of upper portions 64 is interrupted before reaching the steady state, the upper surfaces 30 of wires 26 may not have exactly the same dimensions.

Further, the wavelength of the radiation emitted by a quantum well particularly depends on the proportion of the additional group-III element, for example, indium, incorporated in the ternary compound of the quantum well. This proportion itself depends on the lateral dimensions of active area 40. Thereby, an accurate control of the lateral dimensions of active area 40 enables to accurately control the wavelength of the radiations emitted by active area 40. The wavelength dispersion of the radiations emitted by the light-emitting diodes can thus be decreased.

FIG. 5 shows the structure obtained after the growth of active areas 40 and of semiconductor stacks 42. According to an embodiment, the growth of the layers of active areas 40 and of semiconductor stacks 42 is achieved by PA-MBE. The pressure in the reactor is in the range from $10^{-4}$ to $10^{-7}$ Torr. For the forming of the quantum well or of each quantum well, an additional group-III element is added in the reactor. The ratio of the atomic fluxes of the group-III elements to the atomic flux of the group-V element for the forming of active areas 40 may be in the range from 0.3 to 2. The temperature in the reactor is for example in the range from 600° C. to 850° C., preferably from 700° C. to 800° C.

For the forming of electron-blocking layer 46, an additional group-III element is added in the reactor, the III/V ratio is preferably close to 1, and the ratio of the atomic flux of the additional element to the atomic flux of the group-V element is in the range from 0.1 to 0.3. Electron-blocking layer 46 may be p-type doped, for example, with magnesium. For the forming of electron-blocking layer 46, the temperature in the reactor is for example in the range from 600° C. to 1,000° C., preferably from 700° C. to 950° C., more preferably from 750° to 900° C. For the forming of semiconductor layer 44 or 48, the III/V ratio is preferably smaller than 1.3, particularly in the range from 1.1 to 1.3. For the forming of semiconductor layer 44 or 48, the temperature in the reactor is for example in the range from 700° C. to 900° C., preferably from 750° C. to 850° C.

In FIG. 5, each active area 40 has been shown with a substantially constant cross-section area along axis C. As a variant, the conditions of growth of active area 40 may be selected so that active area 40 has the shape of a truncated pyramid of axis C with a cross-section area which decreases along axis C as the distance to substrate 14 increases. Such a shape may be obtained with no significant loss of the volume of the quantum well or of the quantum wells with respect to the case where the cross-section area is constant. An active area 40 having the shape of a truncated pyramid advantageously enables to increase the thickness of the semiconductor layer 44 covering it and to improve the passivation of the surface of active area 40.

According to another embodiment, the growth of active areas 40 and/or of semiconductor stacks 42 is achieved by MOCVD.

Tests have been performed. For these tests, four wires NW1, NW2, NW3, and NW4 made of GaN having lower portions 62 with different mean diameters have been formed by MOCVD by using openings 24 of different diameters. The upper GaN portions 64 of wires NW1, NW2, NW3, and NW4 have been formed by PA-MBE. Call D0, or initial diameter, the mean diameter of the lower portion 62 of wire 26 measured at the level of the top of the lower portion 62 before the phase of growth by MBE of upper portion 64. The initial diameter of wire NW1 was equal to 120 nm. The initial diameter of wire NW2 was equal to 180 nm. The initial diameter of wire NW3 was equal to 260 nm. The initial diameter of wire NW4 was equal to 480 nm. For the phase of growth by MBE, different temperatures and different Ga/N ratios have been used.

Figure 6:
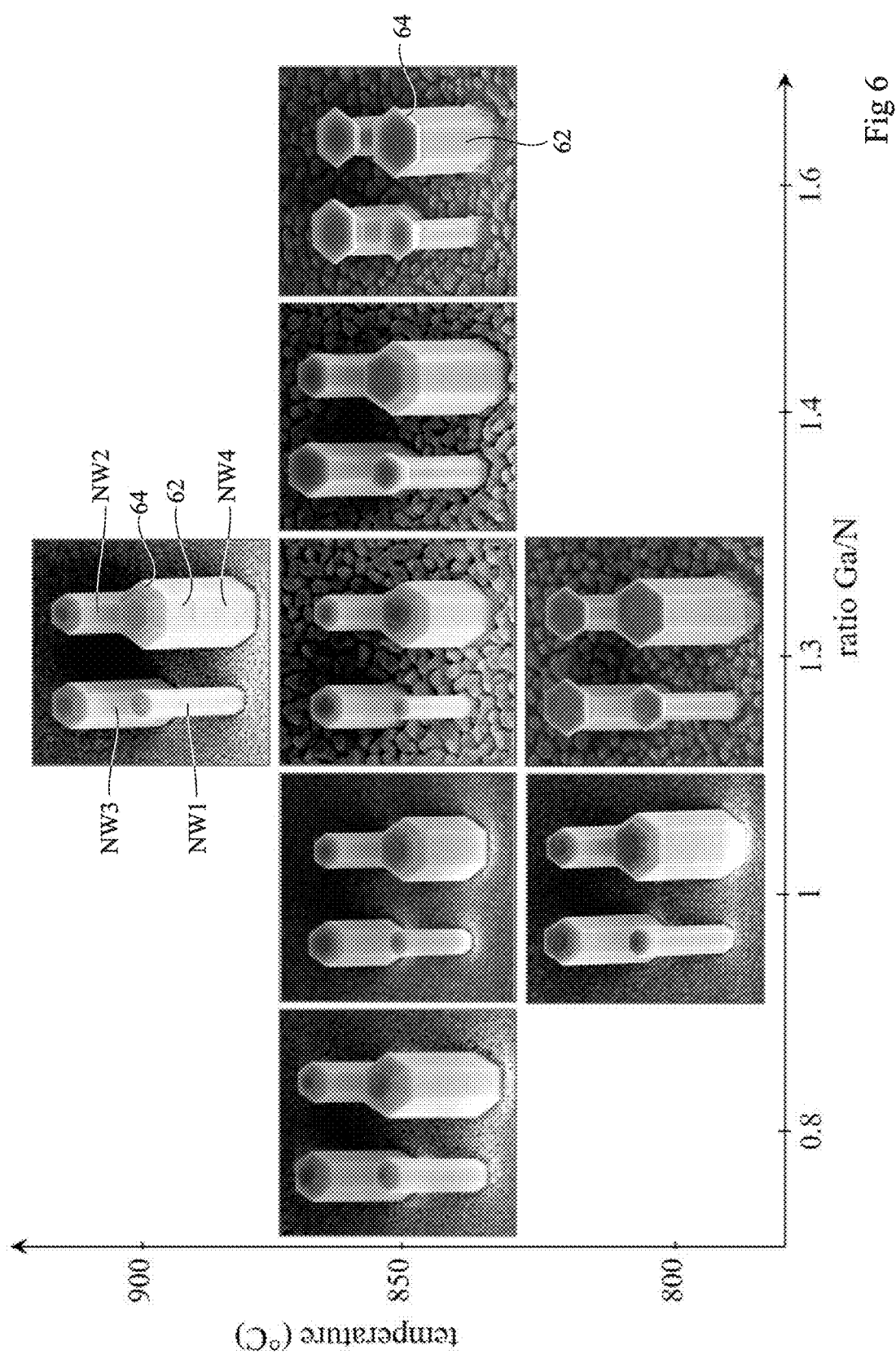
FIG. 6 shows images obtained scanning electron microscopy of nanowires for different growth conditions.

FIG. 6 shows images obtained by scanning electron microscopy of wires NW1, NW2, NW3, and NW4 for different growth temperatures and Ga/N ratios used for the MBE. On each image, wire NW1 is located on the bottom left of the image, wire NW2 is located on the top right of the image, wire NW3 is located on the top left of the image, and wire NW4 is located on the bottom right of the image. In the case where an upper portion 64 of flared shape is desired for most of wires NW1, NW2, NW3, and NW4, it is preferable for the Ga/N ratio to be in the range from 1.3 to 2 and for the temperature to be in the range from 700° C. to 850° C.

The measurement results in the case where the Ga/N ratio was substantially equal to 1.6 and the temperature was equal to substantially 850° C. are gathered in the following table I.

TABLE 1

| Wire | D0 (nm) | D (nm) | D/D0 |
|------|---------|--------|------|
| NW1  | 120     | 434.55 | 3.62 |
| NW2  | 180     | 520.70 | 2.89 |
| NW3  | 260     | 551.65 | 2.12 |
| NW4  | 480     | 626.48 | 1.46 |

Figure 7:
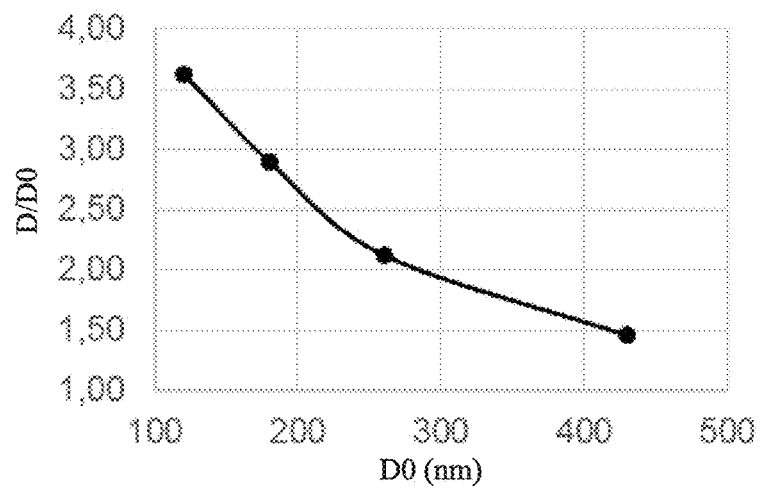
FIG. 7 is a curve of the variation of the ratio of the mean diameter of a nanowire after widening to the mean diameter of the nanowire before widening according to the mean diameter of the nanowire before widening.

FIG. 7 is a curve of the variation of the ratio D/D0 of the mean diameter D of a wire after widening to the initial mean diameter D0 of the nanowire before widening according to the initial mean diameter D0 of the nanowire before widening.

Figure 8:
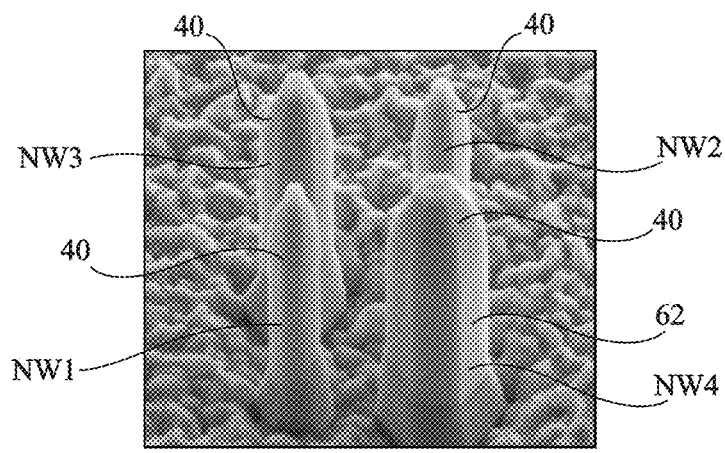
FIG. 8 shows an image obtained by scanning electronic microscopy of an example of certain elements of axial-type light-emitting diodes, each having the structure illustrated in FIG. 1.

FIG. 8 shows an image obtained by scanning electronic microscopy of the wires and of the active areas 40 of axial-type light-emitting diodes formed with wires NW1, NW2, NW3, and NW4 for which only lower portion 62 was present. The lower portions 62 of wires 26 were made of n-type doped GaN. Each active area 40 comprised a single InGaN quantum well between non-intentionally doped GaN barrier layers. Each semiconductor stack 42 comprised an AlGaN blocking layer and a p-type doped GaN semiconductor layer. The lower portions 62 of the wires have been formed by PA-MBE with a Ga/N ratio of 1.3 and a 900° C. temperature. The InGaN quantum wells have been formed by PA-MBE with a Ga+In/N ratio of 1.6 and a 750° C. temperature. The AlGaN blocking layers 46 have been formed by PA-MBE with a Ga+Al/N ratio of 1, an Al/N ratio of 0.2, and a Ga/N ratio of 0.8. The p-type doped semiconductor GaN layers 44 have been formed by PA-MBE with a Ga/N ratio of 0.8 and a 850° C. temperature.

Figure 9:
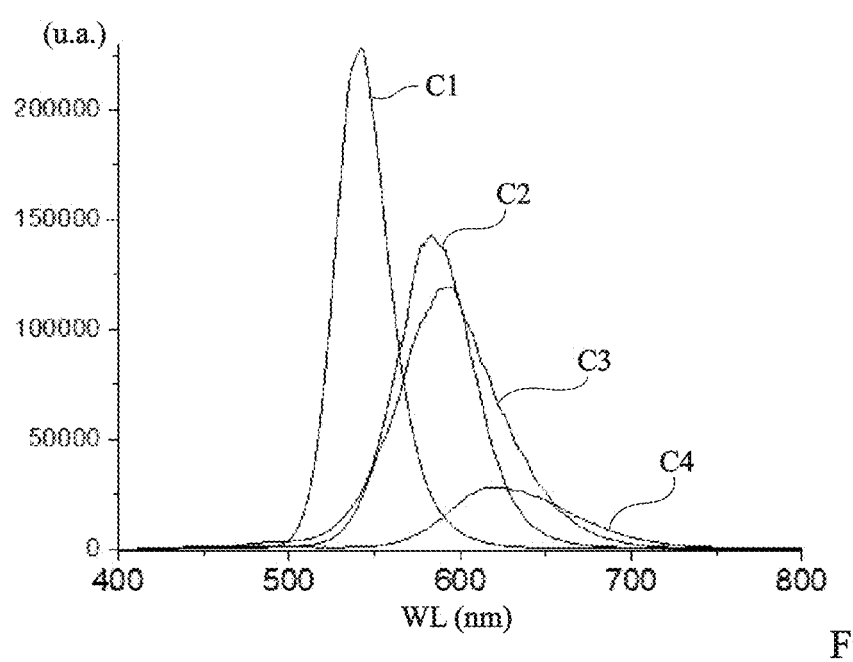
FIG. 9 shows, according to the wavelength, the spectrums of the radiations emitted by the active areas shown in FIG. 8.

FIG. 9 shows curves C1, C2, C3, and C4 of the variation, according to the wavelength, of the spectrum of the radiations emitted by photoluminescence by the active areas 40 of FIG. 8 respectively corresponding to wires NW1, NW2, NW3, and NW4. The difference between the central wavelength of the light-emitting diode corresponding to wire NW1 and the central wavelength of the light-emitting diode corresponding to wire NW4 was approximately 80 nm.

Figure 10:
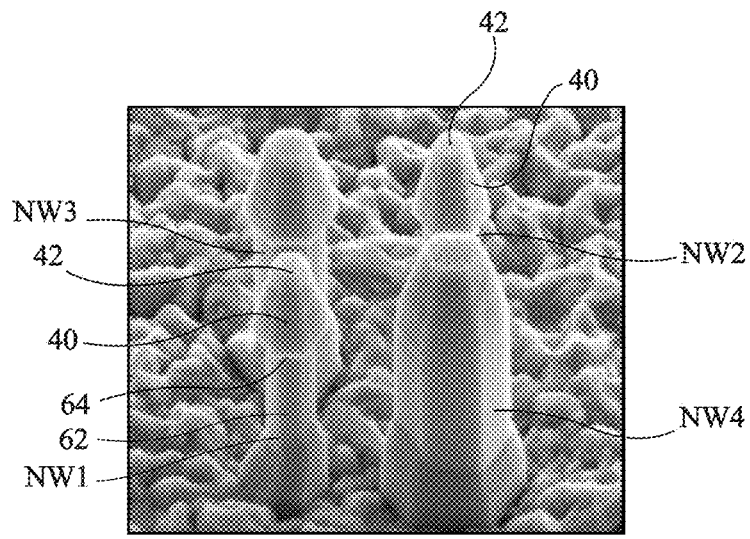
FIG. 10 shows an image obtained by scanning electronic microscopy of an embodiment of certain elements of axial-type light-emitting diodes, each having the structure illustrated in FIG. 2.
Figure 11:
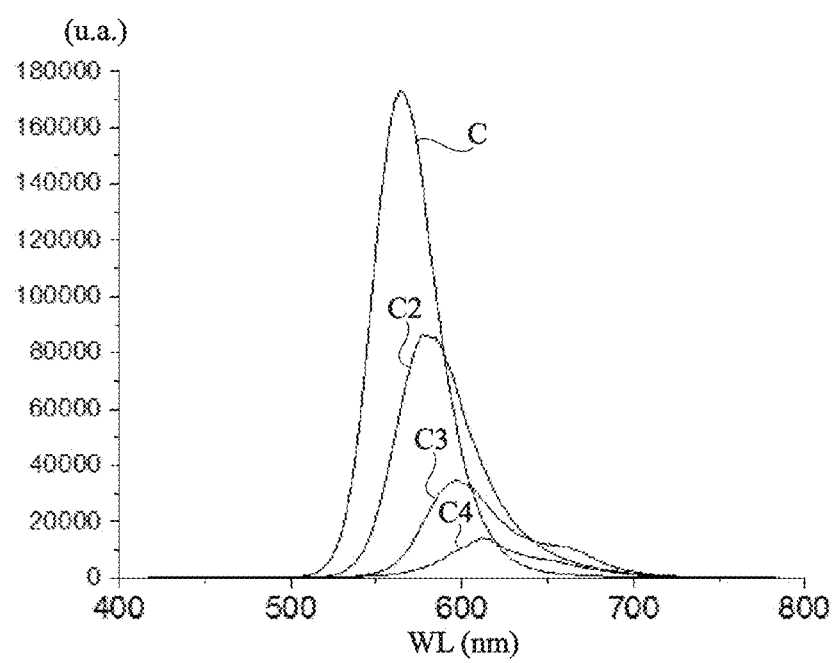
FIG. 11 shows, according to the wavelength, the spectrums of the radiations emitted by the active areas shown in FIG. 10.

FIGS. 10 and 11 are figures respectively similar to FIGS. 8 and 9 in the case where wires NW1, NW2, NW3, and NW4 have been formed as previously described with an upper portion 64 formed by PA-MBE. The upper portions 64 of wires 26 were made of non-intentionally doped GaN. The upper portions 64 of wires 26 have been formed by PA-MBE with a Ga/N ratio of 1.6 and a 850° C. temperature for 10 minutes. The difference between the central wavelength of the light-emitting diode corresponding to wire NW1 and the central wavelength of the light-emitting diode corresponding to wire NW4 was approximately 50 nm. The wavelength dispersion of the active areas shown in FIG. 10 is smaller than the dispersion obtained with the active areas shown in FIG. 8.

Various embodiments and variants have been described. Those skilled in the art will understand that certain features of these various embodiments and variants may be combined, and other variants will occur to those skilled in the art. Finally, the practical implementation of the described embodiments and variants is within the abilities of those skilled in the art based on the functional indications given hereabove.

The invention claimed is:

1. Method of manufacturing an optoelectronic device comprising light-emitting diodes comprising the forming of three-dimensional semiconductor elements made of a III-V compound, each comprising a lower portion and an upper portion, and, for each semiconductor element, the forming of an active area covering the top of the upper portion and the forming of at least one semiconductor layer of the III-V compound covering the active area, characterized in that the upper portions are formed by vapor deposition at a pressure smaller than 1.33 mPa.

2. Method according to claim 1, wherein the lower portion of each light-emitting diode is formed by selective etching or by epitaxial growth, preferably by a metal-organic chemical vapor deposition, or by molecular beam epitaxy.

3. Method according to claim 1, wherein the upper portion of each light-emitting diode is formed by molecular beam epitaxy.

4. Method according to claim 1, wherein, for each semiconductor element, the upper portion is flared with respect to the lower portion.

5. Method according to claim 4, wherein, for each semiconductor element, the top of the upper portion has an area greater by at least 20% than the cross-section area of the lower portion.

6. Method according to claim 4, wherein, for the forming of the upper portion of each light-emitting diode, the III/V ratio is in the range from 1.3 to 2.

7. Method according to claim 4, wherein, for the forming of the upper portion of each light-emitting diode, the temperature of the upper portions is in the range from 700° C. to 850° C.

8. Method according to claim 1, wherein, for the forming of the lower portion of each light-emitting diode, the III/V ratio is in the range from 0.01 to 1.

9. Method according to claim 8, wherein, for the forming of the lower portion of each light-emitting diode, the temperature of the lower portions is in the range from 700° C. to 850° C.

10. Method according to claim 1, wherein the active area of each light-emitting diode is formed by molecular beam epitaxy.

11. Method according to claim 1, wherein the lower portion of each light-emitting diode of the three-dimensional semiconductor elements are microwires, nanowires, micrometer- or nanometer-range conical elements, or micrometer- or nanometer-range frustoconical elements.

12. Method according to claim 1, wherein the active area of each light-emitting diode is the region from which most of the electromagnetic radiation supplied by the light-emitting diodes is emitted.

* * * * *